United States Patent
Peng (10) Patent No.: US 6,650,143 B1
(45) Date of Patent: Nov. 18, 2003

(54) FIELD PROGRAMMABLE GATE ARRAY BASED UPON TRANSISTOR GATE OXIDE BREAKDOWN

(75) Inventor: Jack Zezhong Peng, San Jose, CA (US)

(73) Assignee: Kilopass Technologies, Inc., Sunnyvale, CA (US)

( * ) Notice: Subject to any disclaimer, the term of this patent is extended or adjusted under 35 U.S.C. 154(b) by 0 days.

(21) Appl. No.: 10/191,888

(22) Filed: Jul. 8, 2002

(51) Int. Cl.$^7$ ............................................ H03K 19/094

(52) U.S. Cl. ............................ 326/44; 326/39; 326/41; 326/49

(58) Field of Search .................. 326/38, 39, 44, 326/45, 47, 49; 365/181.01, 185.05, 185.08, 185.11, 185.12, 185.13, 149

(56) References Cited

U.S. PATENT DOCUMENTS

| | | | |
|---|---|---|---|
| 3,634,929 A | 1/1972 | Yoshida et al. ................. 29/577 |
| 4,322,822 A | 3/1982 | McPherson ................. 365/182 |
| 4,488,262 A | 12/1984 | Basire et al. ................. 365/104 |
| 4,490,900 A | 1/1985 | Chiu | |
| 4,502,208 A | 3/1985 | McPherson ................. 438/281 |
| 4,507,757 A | 3/1985 | McElroy ...................... 365/104 |
| 4,543,594 A | 9/1985 | Mohsen et al. .............. 257/530 |
| 4,546,273 A | * 10/1985 | Osman ......................... 307/468 |
| 4,613,886 A | 9/1986 | Chwang ....................... 257/369 |
| 4,823,181 A | 4/1989 | Mohsen et al. .............. 257/530 |
| 4,876,220 A | 10/1989 | Mohsen et al. .............. 438/200 |
| 4,899,205 A | 2/1990 | Hamdy et al. ............... 257/530 |
| 4,943,538 A | 7/1990 | Mohsen et al. .............. 438/215 |
| 4,962,342 A | * 10/1990 | Mead et al. .................. 307/201 |
| 5,138,410 A | 8/1992 | Takebuchi ................... 257/314 |
| 5,304,871 A | 4/1994 | Dharmarajan et al. ......... 326/44 |
| 5,412,244 A | 5/1995 | Hamdy et al. ............... 257/530 |
| 5,496,756 A | 3/1996 | Sharma et al. .............. 438/258 |
| 5,576,568 A | 11/1996 | Kowshik ..................... 257/318 |
| 5,578,848 A | 11/1996 | Kwong et al. | |
| 5,587,603 A | 12/1996 | Kowshik ..................... 257/316 |
| 5,600,265 A | 2/1997 | El Gamal et al. ............. 326/41 |
| 5,675,541 A | 10/1997 | Leterrier ................. 365/189.01 |
| 5,675,547 A | 10/1997 | Koga | |
| 5,825,200 A | 10/1998 | Kolze ........................... 326/38 |
| 5,825,201 A | 10/1998 | Kolze ........................... 326/39 |
| 5,880,512 A | 3/1999 | Gordon et al. .............. 257/530 |

(List continued on next page.)

OTHER PUBLICATIONS

Miranda, Enrique et al; Analytic Modeling of leakage Current Through Multiple Breakdown Paths in SiO2 Films; $39^{th}$ Annual International Reliability Physics Symposium; Orlando, FL 2001.

Lombardo, S. et al; Softening of Breakdown in Ultra–Thin Gate Oxide nMOSFET's at Low Inversion Layer Density; $39^{th}$ Annual International Reliabilty Physics Symposium; Orlando, FL 2001.

Wu, E.W. et al; Voltage–Dependent Voltage–Acceleration of Oxide Breakdown for Ultra–Thin Oxides; IEEE, 2000.

Rasras, Mahmoud et al; Substrate Hole Current Origin After Oxide Breakdown; IEEE, 2000.

Sune, Jordi et al; Post Soft Breakdown Conduction in SiO2 Gate Oxides; IEEE, 2000.

Primary Examiner—Anh Tran
(74) Attorney, Agent, or Firm—Perkins Coie LLP (57) ABSTRACT

A field programmable gate array (FPGA) cell useful in a FPGA array having column bitlines, read bitlines, and row wordlines is disclosed. The cell comprises a capacitor having a first terminal and a second terminal, the first terminal connected to a column bitline, said second terminal connected to a switch control node, the capacitor having a dielectric between the first and second terminal. The cell also includes a select transistor having a gate, a source, and a drain, the gate connected to the read bitline, the source connected to the switch control node, and the drain connected to a row wordline. Finally, the cell includes a switch being controlled by the switch control node.

16 Claims, 7 Drawing Sheets

U.S. PATENT DOCUMENTS

| | | |
|---|---|---|
| 5,909,049 A | 6/1999 | McCollum .................. 257/530 |
| 6,034,893 A | 3/2000 | Mehta |
| 6,064,595 A | 5/2000 | Logie et al. |
| 6,084,428 A | 7/2000 | Kolze et al. .................. 326/41 |
| 6,097,077 A | 8/2000 | Gordon et al. ............... 257/530 |
| 6,157,568 A | 12/2000 | Schmidt |
| 6,214,666 B1 | 4/2001 | Mehta |
| 6,215,140 B1 | 4/2001 | Reisinger et al. |
| 6,232,631 B1 | 5/2001 | Schmidt et al. |
| 6,282,123 B1 | 8/2001 | Mehta |
| 6,294,809 B1 | 9/2001 | Logie |
| 6,297,103 B1 | 10/2001 | Ahn et al. |
| 6,421,293 B1 | 7/2002 | Candelier et al. ........ 365/225.7 |

\* cited by examiner

0.18um LV XPM FPGA CELL OPERATION

| | | VBL | VBLR | VWL | | | PROGRAM | |
|---|---|---|---|---|---|---|---|---|
| PROGRAM | SC/SR | 8 | 3.3 | 0 | | | YES | ⎫ 301 |
| | SC/UR | 8 | 3.3 | 3.3 | | | NO | ⎫ 303 |
| | UC/SR | 0 | 0 | 0 | | | NO | ⎫ 305 |
| | UC/UR | 0 | 0 | 3.3 | | | NO | ⎫ 307 |
| | | | | | | | SENSE CURRENT | ⎫ 309 |
| READ | SC/SR | 1.8 - 3.3 | 1.8 | 0 | | | YES | ⎫ 311 |
| | SC/UR | 1.8 - 3.3 | 1.8 | 1.8 | | | NO | ⎫ 313 |
| | UC/SR | 0 | 0 | 0 | | | NO | ⎫ 315 |
| | UC/UR | 0 | 0 | 1.8 | | | NO | |
| | | | | | | | | |
| OPERATION | | 1.8 | 0.3 - 0.8 | 0 | | | | |

FIGURE 3

0.18um IO XPM FPGA CELL OPERATION

| | | VBL | VBR | VWL | | | PROGRAM | |
|---|---|---|---|---|---|---|---|---|
| PROGRAM | SC/SR | 8 | 3.3 | 0 | | | YES | ⎫ 401 |
| | SC/UR | 8 | 3.3 | 3.3 | | | NO | ⎫ 403 |
| | UC/SR | 0 | 0 | 0 | | | NO | ⎫ 405 |
| | UC/UR | 0 | 0 | 3.3 | | | NO | ⎫ 407 |
| | | | | | | | SENSE CURRENT | ⎫ 409 |
| READ | SC/SR | 3.3 | 3.3 | 0 | | | YES | ⎫ 411 |
| | SC/UR | 3.3 | 3.3 | 3.3 | | | NO | ⎫ 413 |
| | UC/SR | 0 | 0 | 0 | | | NO | ⎫ 415 |
| | UC/UR | 0 | 0 | 3.3 | | | NO | |
| | | | | | | | | ⎫ 417 |
| OPERATION | | 3.3 | 0.3 - 0.8 | 0 | | | YES | |

FIELD PROGRAMMABLE GATE ARRAY BASED UPON TRANSISTOR GATE OXIDE BREAKDOWN

TECHNICAL FIELD OF THE INVENTION

The present invention relates to field programmable gate arrays (FPGA), and more particularly, to a FPGA based upon the breakdown of the gate oxide of a transistor.

BACKGROUND OF THE INVENTION

FPGA's are finding increasing application as logic and/or processing elements. One type of FPGA utilizes SRAM cells, which requires six transistors. This results in a large cell size and therefore low density. Moreover, SRAM based FPGA is volatile.

Another type of FPGA is based upon anti-fuse technology. Although widely accepted, anti-fuse technology requires specialized fuse manufacturing process. Further, a FPGA based upon anti-fuse technology can only be programmed once.

Yet another type of FPGA is based upon flash memory technology. However, flash memory technology requires a relatively more complex semiconductor manufacturing process, thereby increasing cost.

DETAILED DESCRIPTION

A FPGA based on transistors having an ultra-thin dielectric that can be stressed into breakdown (soft or hard breakdown) to set a leakage current level is disclosed. A suitable ultra-thin dielectric is the high quality gate oxide of about 50 Å thickness or less used in a transistor, as is commonly available from presently available advanced CMOS logic processes. Such oxides are commonly formed by deposition, by oxide growth from a silicon active region, or by some combination thereof. Other suitable dielectrics include oxide-nitride-oxide composites, compound oxides, and so forth.

In the following description, numerous specific details are provided to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present invention is related to gate oxide breakdown based flash memory designs developed by the present inventor and assigned to the same assignee as the present invention. Examples are shown in U.S. patent application Ser. No. 09/955,641 filed on Sep. 18, 2001 entitled "SEMICONDUCTOR MEMORY CELL AND MEMORY ARRAY USING A BREAKDOWN PHENOMENA IN AN ULTRA-THIN DIELECTRIC", U.S. patent application Ser. No. 10/024,327 filed on Dec. 17, 2001 entitled "SEMICONDUCTOR MEMORY CELL AND MEMORY ARRAY USING A BREAKDOWN PHENOMENA IN AN ULTRA-THIN DIELECTRIC", U.S. patent application Ser. No. 09/982,034 filed on Oct. 17, 2001 entitled "SMART CARD HAVING NON-VOLATILE MEMORY FORMED FROM LOGIC PROCESS", U.S. patent application Ser. No. 09/982,314 filed on Oct. 17, 2001 entitled "REPROGRAMMABLE NON-VOLATILE OXIDE MEMORY FORMED FROM LOGIC PROCESS", and U.S. patent application Ser. No. 10/133,604 filed Apr. 26, 2002 entitled "HIGH DENSITY SEMICONDUCTOR MEMORY CELL AND MEMORY ARRAY USING A SINGLE TRANSISTOR", each of which is hereby incorporated by reference.

Figure 1:
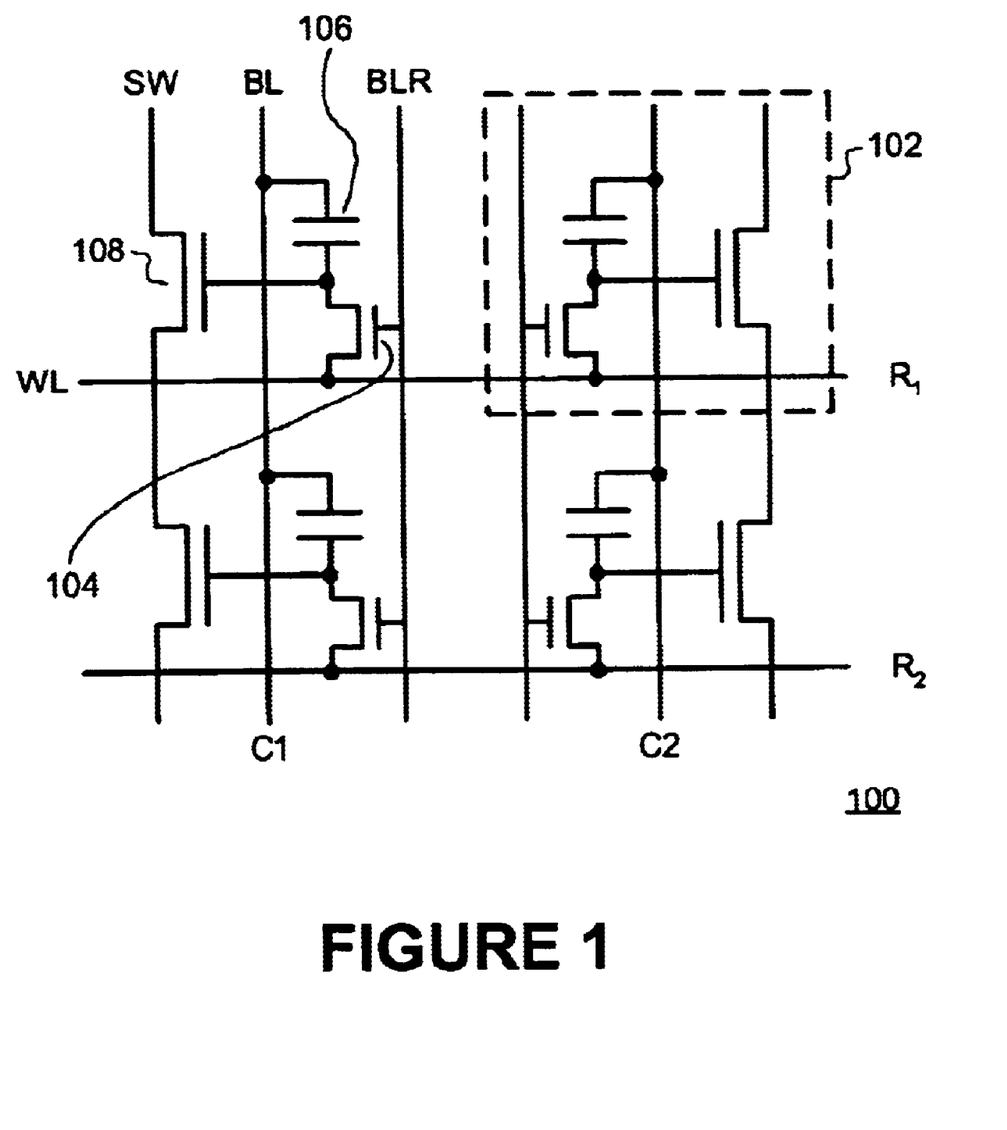
FIG. 1 is a schematic circuit diagram of a portion of a FPGA in accordance with the present invention.

FIG. 1 shows an example of a FPGA array 100 formed in accordance of with the present invention. The array 100 is a two column by two row array, however, it can be appreciated that the array can be any arbitrary size. The array 100 includes four memory cells 102, each of which comprises a select transistor 104, a capacitor 106, and a switch 108.

Examining the memory cell 102 at, for example, the crosspoint of the first row $R_1$ and the first column $C_1$ (also referred to herein as a "bitline" or "column bitline"), the memory cell 102 has the gate of its select transistor 104 connected to a read bitline (BLR) line. The drain of the select transistor 104 is connected to a row line $R_1$ (also referred to herein as a "wordline" or "row wordline"). The source of the select transistor 104 is connected to one terminal of the capacitor 106. The other terminal of the capacitor is connected to the column bitline (BL).

The gate of the switch 108 is also connected to the source of the select transistor 104, thusly, between the source and one terminal of the capacitor 106. This connection point is referred to as a switch control node. The source and drain of the switch 108 are connected in a "daisy chain" manner with the other switches common to that column.

As will be seen below, during the programming step, a relatively large voltage is across the capacitor 106 of the selected column and selected row to break down the gate oxide of the capacitor 106. The other memory cells 102 shown in FIG. 1 are also formed from, in one embodiment, identical cells 102 at the crosspoints of the column bitlines $C_x$ and row wordlines $R_y$, where y=1 to N and N is the total number of rows and where x=1 to M and M is the total number of columns.

The use of memory cells 102 as programmed elements in the FPGA 100 of FIG. 1 is advantageous because the components can be fabricated using many conventional CMOS processes using only a single polysilicon deposition step, without adding any mask steps to them. This is in contrast to "floating gate" type FPGA flash memory, which requires at least two polysilicon layers. This is also in contrast to the anti-fuse type FPGA, which requires special process steps. Further, with modern technological advances, the size of a capacitor and transistor can be made very small. For example, current 0.18 micron, 0.13 micron, and smaller line width processes would greatly increase the density of the FPGA.

Although only a two by two FPGA array 100 is shown, in practice such FPGA arrays may contain tens of thousands cells, or even millions of cells, when fabricated using, for example, an advanced 0.13 $\mu$m CMOS logic process. Even larger arrays will be realized as CMOS logic processes improve further.

Figure 2:
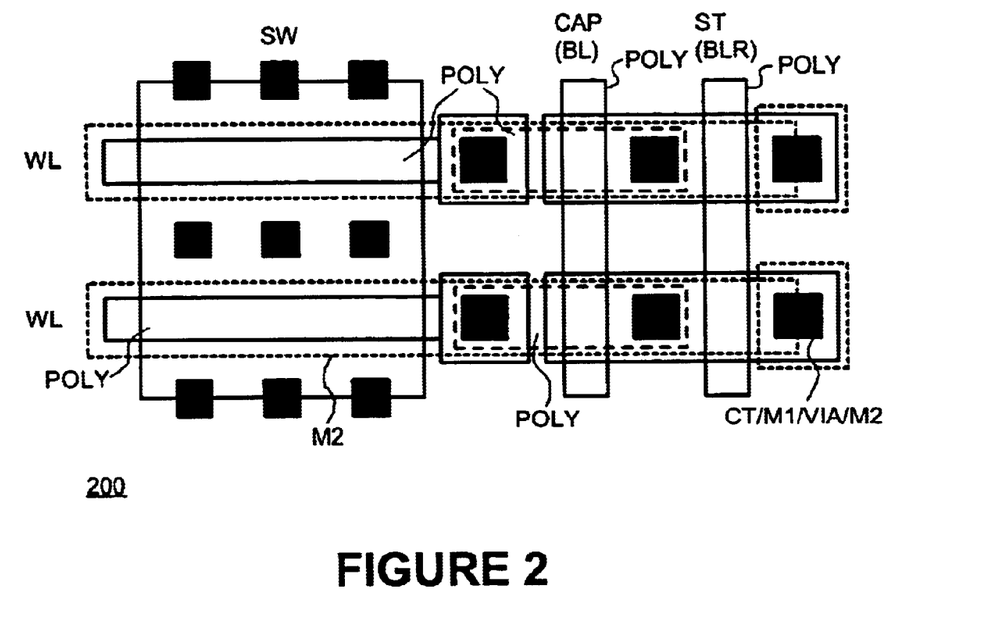
FIG. 2 is a partial layout diagram of a portion of the FPGA represented by FIG. 1.

FIG. 2 shows a partial layout diagram 200 for a portion of the FPGA array 100. The layout diagram of FIG. 2 is suitable for an advanced CMOS logic process. The term MOS is commonly understood to pertain to any gate material, including doped polysilicon and other good conductors, as well as to various different types of gate dielectrics not limited to silicon dioxide, and the term is so used herein. For example, the dielectric may be any type of dielectric, such as an oxide or nitride, which undergoes a hard or soft breakdown upon the application of a voltage for a period of time. In one embodiment, a thermally grown gate silicon oxide of about 50 angstroms (50 A for 0.25 $\mu$m, 30 A for 0.18 $\mu$m and 20 A for 0.13 $\mu$m process) thick is used.

The FPGA array 100 preferably is laid out in a grid in which the column lines such as $C_1$ and $C_2$, are orthogonal to the row lines such as $R_1$ and $R_2$. FIG. 2 shows two cells 102, arrayed as one column by two rows. As seen in FIG. 2, the metal one (M1) line is used to connect the gate of the switch (SW) with one terminal of the capacitor 106.

Further, the drain of the select transistor (ST and 104) is connected to the word line through a $n^+$ diffusion contact, metal one, via one, and metal two (M2). Further, it can be seen that all of the devices (select transistor 104, capacitor 106, and switch 108) are formed from a polysilicon layer over a low voltage (LV) oxide.

The operation of the FPGA array 100 is now explained with reference to the illustrative voltages shown in FIG. 3. It will be appreciated that the voltages are illustrative, and that different voltages are likely to be used in different applications or when different process technologies are used. During programming, the various cells in the FPGA array 100 are exposed to one of four possible programming voltage combinations, which are shown on lines 301, 303, 305, and 307 of FIG. 3. Read voltages are shown on lines 309, 311, 313, and 315. Assume that a FPGA cell 102 (note that the cell 102 in FIG. 2 is a generic reference to all of the cells in the FPGA 100) is selected for programming and is located at the crosspoint of $R_1$ and $C_1$. The selected memory cell 102 is referred to as at the selected row and selected column ("SR/SC"). As shown on line 301, the voltage on the selected wordline $R_1$ (designated as $V_{wl}$ or "voltage on the wordline") is 0 volts and the voltage on the bitline $C_1$ (designated as $V_{bl}$ or "voltage on the bitline") is 8 volts.

Further, the voltage on the selected read bitline (designated as $V_{blr}$ or "voltage on the read bitline") is 3.3 volts.

This set of voltages results in the select transistor 104 being "on", which places 0 volts from the word line onto one terminal of the capacitor 106. The other terminal of the capacitor 106 is connected to the bitline ($V_{bl}$) which is at 8 volts. Thus, the voltage across the capacitor 106 is 8 volts. The gate oxide of the capacitor 106 is designed to break down at this potential difference, which programs the FPGA cell as will be described further below. When the oxide of the capacitor 106 breaks down, this converts the capacitor 106 into a resistor.

It can be appreciated that the precise magnitude of voltages applied is dependent upon the thickness of the gate oxide and other factors. Thus, for example, for a 0.13 micron CMOS process, the gate oxide is typically thinner, thereby requiring a lower voltage differential across the capacitor 106.

With $R_1$ and $C_1$ being the selected row and column, consider the impact on the FPGA cell 102 at the crosspoint of a selected row and an unselected column ("SR/UC"), e.g., $R_1$ and $C_2$. As shown on line 305, the voltage on the wordline $R_1$ is 0 volts, the voltage at the unselected read bitline ($V_{blr}$) is 0 and the voltage on the unselected bitline $C_2$ is 0. Because 0 volts is on the gate of the select transistor 104, the FPGA cell 102 does not program under these conditions.

With $R_1$ and $C_1$ being the selected row and column, consider the impact on the FPGA cell 102 at the crosspoint of a selected column and an unselected row ("UR/SC"), e.g. $R_2$ and $C_1$. As shown on line 303, the voltage on the unselected wordline $R_2$ is 3.3 volts, the voltage at the selected read bitline ($V_{blr}$) is 3.3 volts, and the voltage on the bit line $C_1$ is 8 volts. Because the read bitline voltage is 3.3 volts, this causes the select transistor 104 to be in an "on" condition, allowing the 3.3 volts on the word line to be placed on one terminal of the capacitor 106. The other terminal of the capacitor is tied to the voltage on the bitline, or in this case 8 volts. This causes a potential difference of 4.7 volts across the gate oxide of the capacitor 106. The memory cell 102 is designed to not program under these conditions.

With $R_1$ and $C_1$ being the selected row and column, consider the impact on the FPGA cell 102 at the crosspoint of an unselected column and an unselected row ("UR/UC"), e.g. $R_2$ and $C_2$. As shown on line 307, the voltage on the unselected wordline $R_2$ is 3.3 volts, the voltage at the unselected read bitline ($V_{blr}$) is 0 volts, and the voltage on the unselected bitline $C_2$ is 0 volts. Because 0 volts is on the gate of the select transistor 104, the select transistor is in the "off" position, leaving one terminal of the capacitor 106 floating. The other terminal of the capacitor 106 is at 0 volts by virtue of its connection to the bitline. FPGA cell 102 does not program under these conditions.

After a FPGA cell 102 has been programmed by breaking down the gate oxide of the capacitor 106, the physical characteristics of the cell 102 is changed. In particular, the capacitor 106 becomes a resistive element. Note that, during programming, although the voltage across the select transistor oxide (i.e. 3.3 volts on the gate of the select transistor 104) is larger than is typical (1.8 volts for 0.18 micron CMOS), this higher voltage will not break down the gate oxide of the select transistor 104 because of the short programming time (normally less than a few seconds).

The FPGA array 100 is read in the following manner. A read select voltage of 1.8–3.3 volts is placed on the selected column bitline ("SC"), a read select voltage of 1.8 volts is placed on the selected bitline read ($V_{blr}$), and a voltage of 0 volts is placed on the selected row wordline ("SR"). Note that these voltages are for a typical 0.18 micron CMOS process. Lower voltages would be typically used for smaller more advanced CMOS processes. For example, for a 0.13 micron CMOS process, the read select voltage on the selected column bitline and on the selected read bitline may be approximately 1.2 volts.

Assume that $R_1$ and $C_1$ are the selected row and column ("SC/SR") and that the FPGA cell 102 at that crosspoint is programmed. As shown on line 309, 1.8–3.3 volts (a read select voltage) is applied via bitline $C_1$ to one terminal of the capacitor 106. Note that a higher bitline voltage will enable a higher read current to be sensed from the bitline. Further, the gate of the select transistor 104 has applied 1.8 volts via the read bitline and 0 volts is applied to the drain of the select transistor 104 via the wordline $R_1$. This causes the select transistor 104 to be "on". Nevertheless, even though the select transistor is "on", there is still some amount of resistance across the select transistor. Furthermore, there is 1.8–3.3 volts across the capacitor 106, which if programmed, will cause a leakage current (typically over 10 microamps) to flow from the selected column bitline to the selected row wordline. In effect, the programmed capacitor 106 and the select transistor 104 form a voltage divider, whose middle node is connected to the gate of the switch 108. The result of this voltage divider is that a voltage is placed on the gate of the switch 108 sufficient to turn on the switch 108. If the cell 102 has not been previously programmed, the capacitor 106 has a much higher resistance than the select transistor 104. Further, because the select transistor 104 is turned on, this causes the wordline voltage of 0 volts to be placed on the switch 108, which causes the switch 108 to be off With $R_1$ and $C_1$ being the selected row and column for the read operation, consider the impact on the cell 102 at the crosspoint of a selected column and an unselected row ("UR/SC"), e.g. $R_2$ and $C_1$. As shown on line 311, 1.8–3.3 volts (a read select voltage) is applied via bitline $C_1$ to one terminal of the capacitor 106. Further, the gate of the select transistor 104 has applied 1.8 volts via the read bitline and 1.8 volts is applied to the source of the select transistor 104 via the wordline $R_1$. This causes the select transistor 104 to be "off".

With $R_1$ and $C_1$ being the selected row and column for the read operation, consider the impact on the cell 102 at the crosspoint of an unselected column and a selected row ("SR/UC"), e.g. $R_1$ and $C_2$. As shown on line 313, 0 volts (a read select voltage) is applied via bitline $C_2$ to one terminal of the capacitor 106. Further, the gate of the select transistor 104 has applied 0 volts via the read bitline and 0 volts is applied to the drain/source of the select transistor 104 via the wordline $R_1$. Under these circumstances, there will no current flow from the wordline to the bitline.

With $R_1$ and $C_1$ being the selected row and column for the read operation, consider the impact on the cell 102 at the crosspoint of an unselected column and a selected row ("UR/UC"), e.g. $R_2$ and $C_2$. As shown on line 315, 0 volts (a read select voltage) is applied via bitline $C_2$ to one terminal of the capacitor 106. Further, the gate of the select transistor 104 has applied 0 volts via the read bitline and 1.8 volts is applied to the drain/source of the select transistor 104 via the wordline $R_2$. Under these circumstances, since the selected device 104 is at off state, there will no current flow from the wordline to the bitline.

During operation, the following voltages are used. First, a wordline voltage of 0 volts is applied. Next, a bitline voltage of 1.8 volts is applied and a bitline read voltage of 0.3 to 0.8 volts is applied. The $V_{blr}$ of 0.3 to 0.8 volts is applied to make the select transistor 104 operate in a weakly on state, so only minimal leakage current occurs (on the order of nA).

Figure 3:
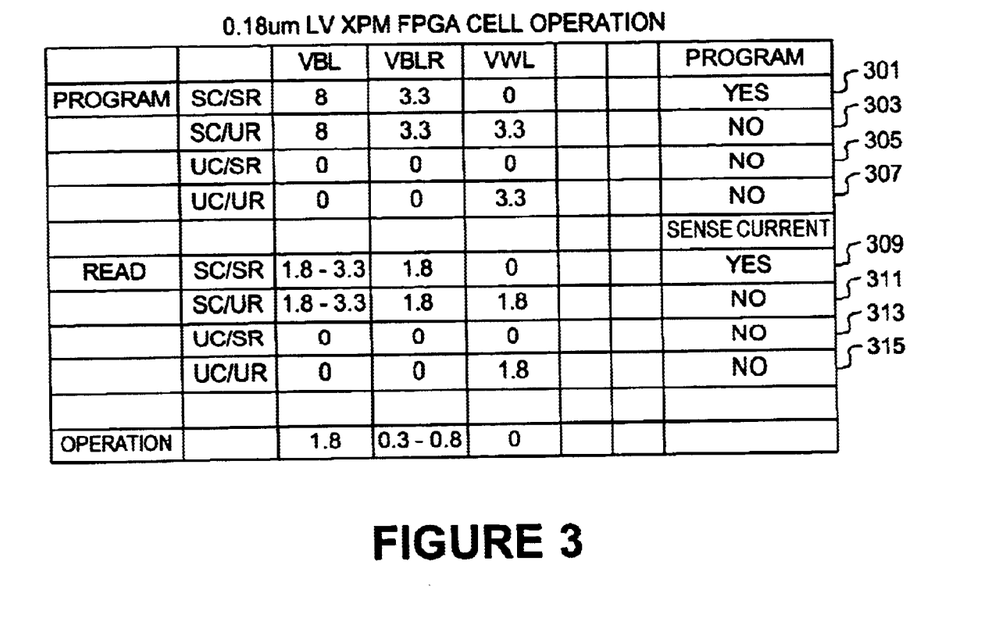
FIG. 3 is a table of voltages showing the operation of the FPGA cell of FIGS. 1–3.
Figure 4:
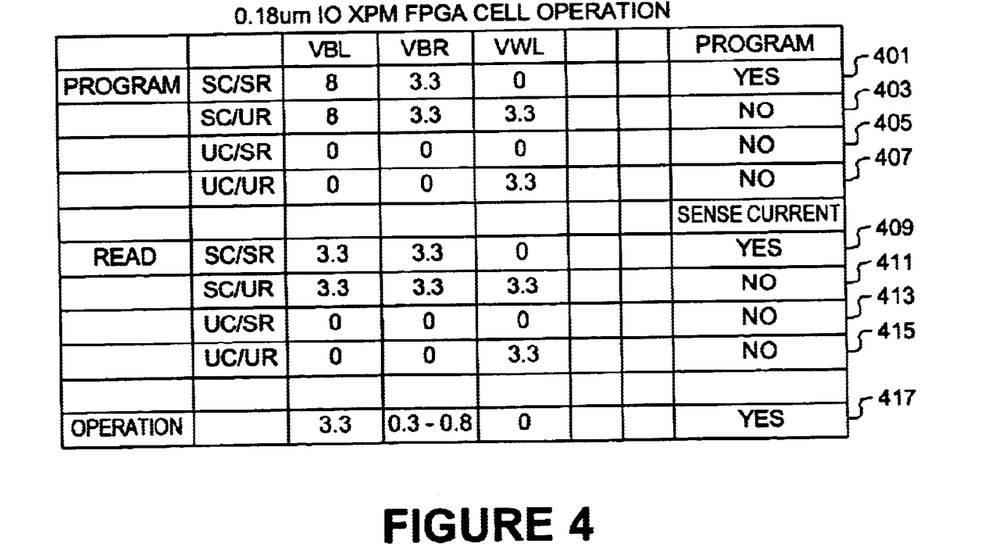
FIG. 4 is a table of voltages showing the operation of an alternative embodiment of a FPGA cell.

In the embodiment described in FIGS. 1–3, the gate voltage of the switch 108 will be generally equal or less that $V_{cc}$ (1.8 volts for a 0.18 micron CMOS process). Thus, the switch 108 can only pass $V_{cc}$–$V_t$. This will affect the speed performance of the FPGA circuit. In an alternative embodiment, the switch 108 and the select transistor 104 have their gate oxides formed thicker, such as that used in input/output devices. For example, the thickness of the gate oxides for the switch 108 and the select transistor 104 may be on the order of 60 angstroms or thicker. The gate oxide of the capacitor 106 should be maintained at the conventional thickness for the particular CMOS process, e.g. 30 angstroms for a 0.18 CMOS process. The programming and read voltages for this alternative embodiment are shown in FIG. 4.

In this alternative embodiment, during the read and programming operations, the bitline voltage can be biased to 3.3 volts (compared to 1.8 volts in the embodiment of FIGS. 1–3). The switch 108 will have 3.3 volts on its gate, so it can fully pass a $V_{cc}$ with extra drive gate voltage. Thus, the programmed switch will have very low resistance so as to improve the speed performance.

Various studies of oxide breakdown, which were performed in contexts different than the cells 102 shown in the array 100, indicate suitable voltage levels for breaking down ultra-thin gate oxides and establishing that the breakdown is controllable. When an ultra-thin gate oxide is exposed to voltage-induced stress, breakdown in the gate oxide occurs. Although the actual mechanisms leading to the intrinsic breakdown of gate oxide are not well understood, the breakdown process is a progressive process passing through a soft breakdown ("SBD") stage followed by a hard breakdown ("HBD") stage. One cause of breakdown is believed to be oxide defect sites. These may act alone to cause breakdown, or may trap charges and thereby cause high local fields and currents and a positive feedback condition that leads to thermal runaway. Improved fabrication processes resulting in fewer oxide defects are reducing the occurrence of this type of breakdown. Another cause of breakdown is believed to be electron and hole trapping at various sites even in defect-free oxide, which also leads to thermal runaway.

Figure 5:
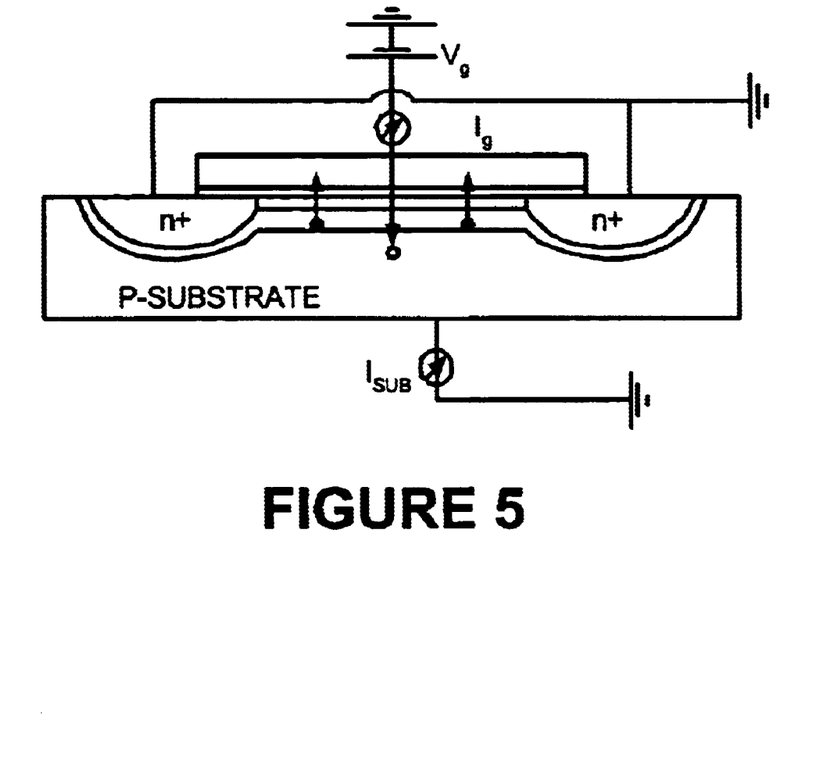
FIG. 5 is a cross-section diagram of an experimental setup.
Figure 6:
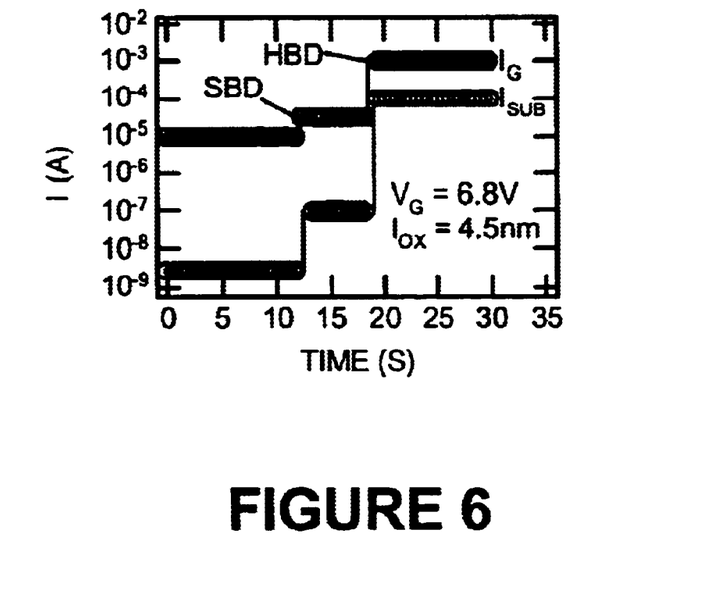
FIG. 6 is a graph showing the effect of a constant voltage stress on an ultra-thin gate oxide.
Figure 8:
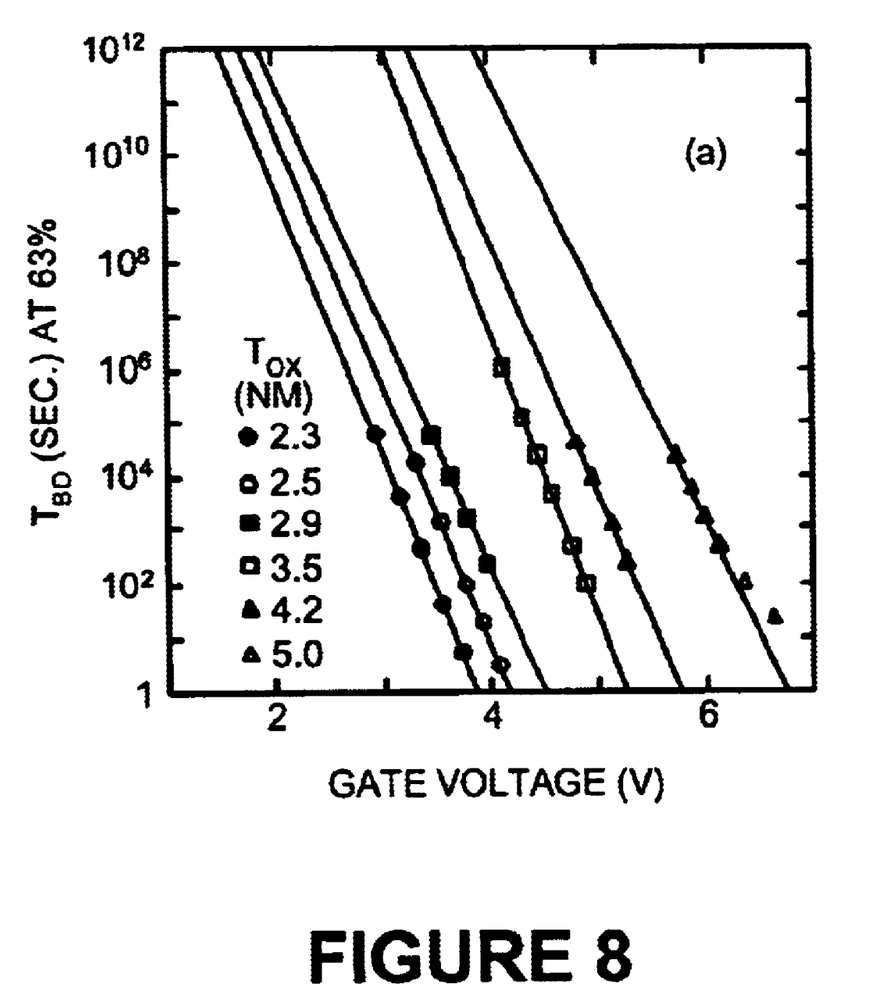
FIG. 8 is a graph showing time-to-breakdown at 63% distribution vs. gate voltage in a semi-log scale measured on n-channel field effect transistors (inversion) for various oxide thickness.

Rasras et al. performed a carrier separation experiment which demonstrated that, under positive gate bias, impact ionization of the electrons in the substrate is the dominant source of the substrate hole current. Mahmoud Rasras, Ingrid De Wolf, Guido Groeseneken, Robin Degraeve, Herman e. Maes, Substrate Hole Current Origin after Oxide Breakdown, EDM 00-537, 2000. A constant voltage stress experiment was performed on ultra-thin oxide in an arrangement in which channel inversion was involved, and established that both SBD and HBD may be used for storing data, and that a desired degree of SBD or HBD may be obtained by controlling the time over which the gate oxide storage element is stressed. FIG. 5 shows a schematic cross-sectional representation of the experimental setup. The effect of the constant voltage stress on the ultra-thin gate oxide is shown in the graph of FIG. 6, in which the x-axis is time in seconds and the y-axis is current in amperes expressed logarithmically. FIG. 8 shows the gate and substrate hole current measured before and after soft and hard breakdown under constant voltage stress. For roughly 12.5 seconds, the total current is substantially constant and dominated by an electron current as measured by $I_g$. The leakage is believed to be due to Fowler-Nordheim ("FN") tunneling and stress-induced leakage current ("SILC"). At about 12.5 seconds, a large jump in the measured substrate hole current is observed, which signals the onset of a soft breakdown ("SBD"). The total current remains substantially constant at this new level, albeit with some fluctuation in the substrate current, from about 12.5 seconds to about 19 seconds. At about 19 seconds, large jumps in both the electron current and the substrate hole current signal the onset of hard breakdown ("HBD"). FIG. 6 shows that a desired degree of SBD or HBD may be obtained by controlling the time over which the gate oxide storage element is stressed.

Figure 7:
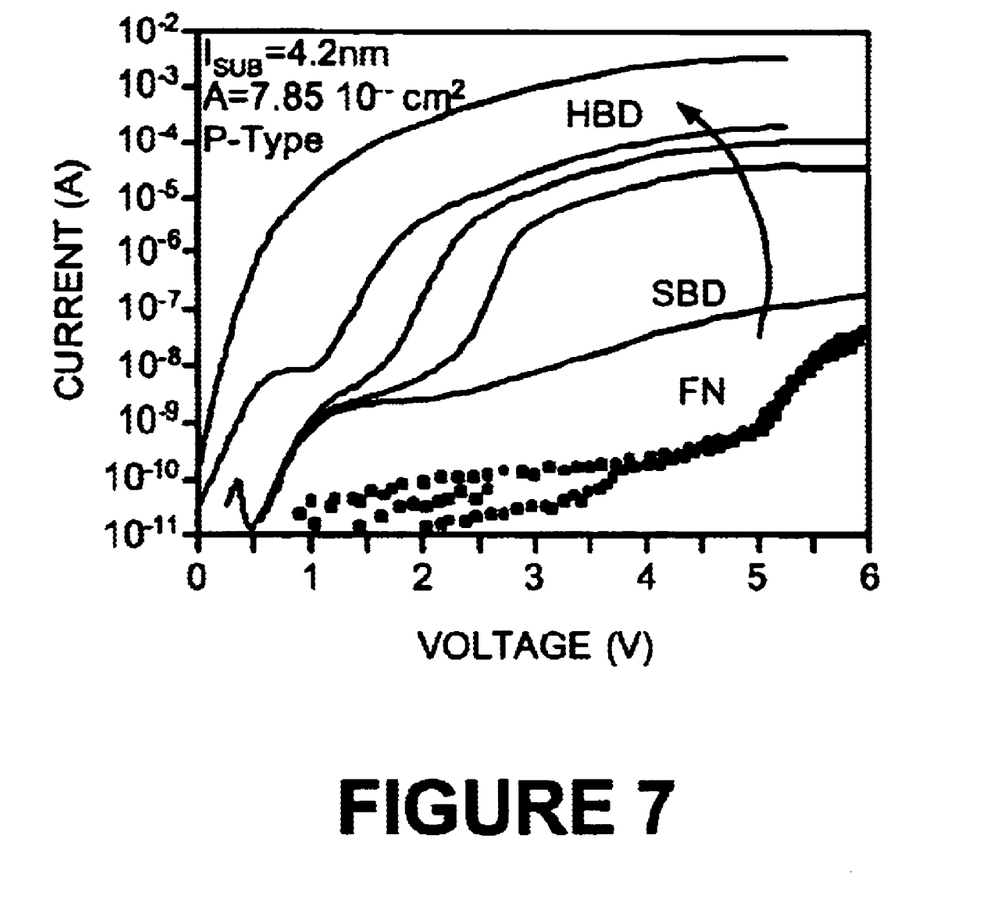
FIG. 7 is a graph showing various stages in the current-voltage characteristics of an ultra-thin gate oxide as degradation proceeds.

Sune et al. studied post SBD conduction in ultra-thin silicon dioxide films. Jordi Sune, Enrique Miranda, Post Soft Breakdown conduction in SiO2 Gate Oxides, IEDM 00-533, 2000. Various stages in the current-voltage ("I-V") characteristics of an ultra-thin gate oxide as degradation proceeds are shown in FIG. 7, in which the x-axis is voltage in volts and the y-axis is current in amperes expressed logarithmically. FIG. 7 shows that a broad range of voltages may be used to program the gate oxide storage element, and that either SBD or HBD may be used to store information in the gate oxide storage element. Several post breakdown I-V characteristics are also included that show the evolution from SBD to HBD. The amount of the leakage current resulting at SBD and HBD as well as at the intermediate situations between these two extremes is roughly linearly dependent on the magnitude of the voltage in a range of about 2.5 volts to 6 volts.

Wu et al. studied the voltage dependency of voltage acceleration for ultra-thin oxides. E. Y. Wu et al., Voltage-Dependent Voltage-Acceleration of Oxide Breakdown for Ultra-Thin Oxides, IEDM 00-541, 2000. FIG. 10 is a graph of time-to-breakdown at 63% distribution vs. gate voltage in a semi-log scale measured n channel FETs (inversion) for oxide thickness varying from 2.3 nm to 5.0 nm. The distributions are in general agreement and are linear, further indicating that the process is controllable.

Figure 9:
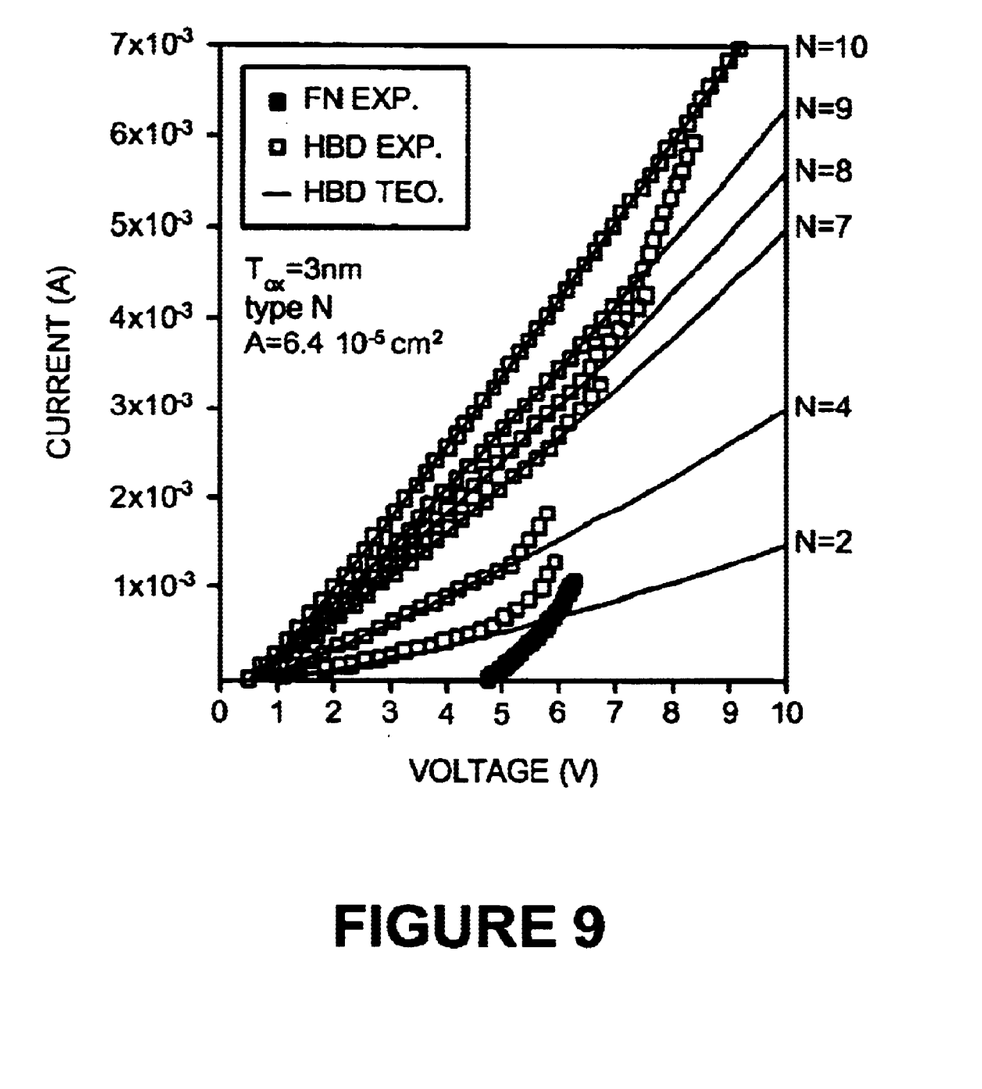
FIG. 9 is a graph showing the current-voltage characteristics of n-type devices measured after the detection of successive breakdown events.

Miranda et al. measured the I-V characteristics of nMOS-FET devices having an oxide thickness of 3 nm and an area of $6.4 \times 10^{-5}$ cm$^2$ after the detection of successive breakdown events. Miranda et al., "Analytic Modeling of Leakage Current Through Multiple Breakdown Paths in SiO$_2$ Films", IEEE 39$^{th}$ Annual International Reliability Physics Symposium, Orlando, Fla., 2001, pp 367–379. FIG. 9 shows the results corresponding to the linear regime in which "N" is the number of conducting channels. The results are quite linear, indicating that the path is essentially resistive.

The transistor used in the memory cells described herein in most cases are normal low voltage logic transistors having, for example, an ultra-thin gate oxide thickness on the order of 50 Å for a 0.25 μm process, or on the order of 20 Å for a 0.13 μm process. The voltage across such an ultra-thin gate oxide can be temporarily during programming much higher than $V_{cc}$, which typically is 2.5 volts for an integrated circuit fabricated with a 0.25 μm process, and 1.2 volts for an integrated circuit fabricated with a 0.13 μm process. Such ultra-thin oxides typically can stand up to as much as 4 or 5 volts without significant degradation on the transistor performance.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. For example, the various voltages set forth in the various examples are only illustrative, since one has some discretion as to the precise voltage to select within a range of voltages, and the voltages are in any event dependent on the device characteristics. The terms row wordline and column bitline have been used to describe types of lines commonly used in memories, but some memories may have alternatives thereto. Further, the various doping types may be reversed, such that an n-channel transistor described above may be replaced with a p-channel transistor. These and other variations and modifications of the embodiments disclosed herein may be made without departing from the scope and spirit of the invention.

What is claimed is:

1. A field programmable gate array (FPGA) cell useful in a FPGA array having column bitlines, read bitlines, and row wordlines, the cell comprising:
    a capacitor having a first terminal and a second terminal, the first terminal connected to a column bitline, said second terminal connected to a switch control node, said capacitor having a dielectric between said first terminal and said second terminal;
    a select transistor having a gate, a source, and a drain, said gate connected to said read bitline, said source connected to said switch control node, and said drain connected to a row wordline; and
    a switch being controlled by said switch control node.

2. The cell of claim 1 wherein said switch is a MOSFET and a gate of said MOSFET being connected to said switch control node.

3. The cell of claim 2 wherein said switch and said select transistor have gate oxides that are thicker than the dielectric of said capacitor.

4. The cell of claim 1 wherein said first terminal of said capacitor, said gate of said select transistor and a gate of said switch is formed from the same layer of polysilicon.

5. The cell of claim 1 wherein a first metal layer connects said switch control node and said gate of said switch.

6. The cell of claim 3 wherein said gate oxides of said switch and select transistor are the thickness of input/output transistors for the CMOS process.

7. A method of operating a field programmable gate array (FPGA) comprising a plurality of row wordlines, a plurality of column bitlines, a plurality of read bitlines, and a plurality of FPGA cells at respective crosspoints of the row lines and column bitlines, said cells comprising a capacitor having a first terminal and a second terminal, the first terminal connected to a column bitline, said second terminal connected to a switch control node, said capacitor having a dielectric between said first terminal and said second terminal, a select transistor having a gate, a source, and a drain, said gate connected to said read bitline, said source connected to said switch control node, and said drain connected to a row wordline, and a switch being controlled by said switch control node, the method comprising:
    applying a first voltage to a selected one of the column bitlines and gate of a selected one of said select transistor; and
    applying a second voltage to a selected one of the row wordlines;
    wherein the first voltage and the second voltage form a potential difference across the dielectric of said capacitor to break down said dielectric converting said capacitor into a resistive device.

8. The method of claim 7 further including applying a third voltage on the row wordlines not corresponding to said selected select transistor.

9. The method of claim 7 wherein said selected select transistor is read by applying a fourth voltage on the gate of said selected select transistor and on said column bitline.

10. The method of claim 9 further including applying a fifth voltage on the row wordlines not corresponding to said selected select transistor.

11. A field programmable gate array (FPGA) comprising a plurality of row wordlines, a plurality of column bitlines, a plurality of read bitlines, and a plurality of cells at respective crosspoints of the row wordlines and column bitlines, each of the cells comprising:

a capacitor having a first terminal and a second terminal, the first terminal connected to a column bitline, said second terminal connected to a switch control node, said capacitor having a dielectric between said first terminal and said second terminal;

a select transistor having a gate, a source, and a drain, said gate connected to said a read bitline, said source connected to said switch control node, and said drain connected to a row wordline; and a switch being controlled by said switch control node.

12. The cell of claim 11 wherein said switch is a MOSFET and a gate of said MOSFET being connected to said switch control node.

13. The cell of claim 12 wherein said switch and said select transistor have gate oxides that are thicker than the dielectric of said capacitor.

14. The cell of claim 11 wherein said first terminal of said capacitor, said gate of said select transistor and a gate of said switch is formed from the same layer of polysilicon.

15. The cell of claim 11 wherein a first metal layer connects said switch control node and said gate of said switch.

16. The cell of claim 13 wherein said gate oxides of said switch and select transistor are the thickness of input/output transistors for the CMOS process.

* * * * *

UNITED STATES PATENT AND TRADEMARK OFFICE
CERTIFICATE OF CORRECTION

PATENT NO. : 6,650,143 B1
DATED : November 18, 2003
INVENTOR(S) : Jack Zezhong Peng It is certified that error appears in the above-identified patent and that said Letters Patent is hereby corrected as shown below:

<u>Title page,</u>
Item [56], References Cited, OTHER PUBLICATIONS, "Miranda, Enrique et al.," reference, "leakage" should be -- Leakage --;

<u>Column 5,</u>
Line 35, insert period after "off";

<u>Column 6,</u>
Line 55, "EDM" should be -- IEDM --;

Signed and Sealed this

Twentieth Day of January, 2004

JON W. DUDAS
*Acting Director of the United States Patent and Trademark Office*